United States Patent
Sugai

(10) Patent No.: US 8,236,621 B2
(45) Date of Patent: Aug. 7, 2012

(54) MOLD RESIN SEALING DEVICE AND MOLDING METHOD

(75) Inventor: Akira Sugai, Tokyo (JP)

(73) Assignee: Lapis Semiconductor Co., Ltd., Tokyo (JP)

( * ) Notice: Subject to any disclaimer, the term of this patent is extended or adjusted under 35 U.S.C. 154(b) by 0 days.

(21) Appl. No.: 12/929,304

(22) Filed: Jan. 13, 2011

(65) Prior Publication Data

US 2011/0171786 A1 Jul. 14, 2011

(30) Foreign Application Priority Data

Jan. 14, 2010 (JP) ................................. 2010-005935

(51) Int. Cl.
  *H01L 21/56* (2006.01)
  *H01L 21/00* (2006.01)
(52) U.S. Cl. ................. 438/127; 257/E21.504
(58) Field of Classification Search .......... 438/127; 100/41, 42, 194, 237; 264/272.11, 512; 425/144
See application file for complete search history.

(56) References Cited

U.S. PATENT DOCUMENTS

| 6,478,562 B1 * | 11/2002 | Miyajima | 425/89 |
| 2009/0127732 A1 * | 5/2009 | Tamura | 264/101 |

FOREIGN PATENT DOCUMENTS

| JP | 2001-044222 A | 2/2001 |
| JP | 2005-064456 A | 3/2005 |

* cited by examiner

*Primary Examiner* — William D Coleman
*Assistant Examiner* — Christine Enad
(74) *Attorney, Agent, or Firm* — Rabin & Berdo, P.C.

(57) ABSTRACT

A mold resin sealing device for sealing a surface of a semiconductor wafer with a mold resin, includes: a first mold die; and a second mold die disposed opposite to the first mold die, the second mold die having a second surface; wherein the first mold die includes a first part having a first surface facing the second surface of the second mold die and having an opening in a central region of the first surface; and a first step-like movable part capable of moving in the opening in both directions so that the first step-like movable part moves toward and away from the second mold die.

6 Claims, 9 Drawing Sheets

MOLD RESIN SEALING DEVICE AND MOLDING METHOD

BACKGROUND OF THE INVENTION

1. Field of the Invention

The present invention relates to a mold resin sealing device and a molding method for sealing a semiconductor wafer with a mold resin.

2. Description of the Related Art

Various molding methods for sealing a semiconductor wafer with a mold resin have been proposed. See Japanese Patent Kokai Publication No. 2001-44222 (Patent Document 1) and Japanese Patent Kokai Publication No. 2005-64456 (Patent Document 2), for example.

In the first method disclosed in the Patent Document 1, a semiconductor wafer 102 is set on a lower surface of an upper mold die 101 and a mold resin 112 is set on an upper surface of a lower mold die 111 as illustrated in FIG. 1, and then the upper mold die 101 and the lower mold die 111 are clamped to press and spread the mold resin 112 as illustrated in FIG. 2, thereby forming a molded resin body covering a surface of the semiconductor wafer 102.

In the second method disclosed in the Patent Document 2, as illustrated in FIG. 3, a step-like part 113 which is higher as it approaches a central region is provided on the lower mold die 111 so that a distance between the upper mold die 101 and the lower mold die 111 or a distance between the upper mold die 101 and the step-like part 113 is larger as it approaches an outer circumference part of the semiconductor wafer 102. The mold resin 112 is set on the step-like part 113 and then the upper mold die 101 and the lower mold die 111 are clamped. In the second method, as illustrated in FIG. 4, the semiconductor wafer 102 is sealed with a molded resin body 112a having a stair-like shape which is higher as it approaches an outer circumference part of the molded resin body 112a.

However, in the first method, since a distance between the upper mold die and the lower mold die becomes narrow when clamped, a flowing spied of the mold resin between the upper mold die and the lower mold die is too fast in the outer circumference part of the semiconductor wafer and so voids occur in the mold resin because of air involved at a post on the semiconductor wafer (jetting, for example) or the like.

The second method prevents, by providing the step-like part, the flowing speed of the mold resin from becoming too fast in the outer circumference part of the semiconductor wafer and so voids which occur in the mold resin are reduced. However, in the second method, a molded resin after the molding process has an uneven surface and it is difficult to employ a next process on the uneven surface of the molded resin.

SUMMARY OF THE INVENTION

An object of the present invention is to provide a mold resin sealing device and a molding method capable of preventing voids from occurring in the mold resin and the molded resin after the molding process from having an uneven surface.

According to an aspect of the present invention, a mold resin sealing device for sealing a surface of a semiconductor wafer with a mold resin, includes: a first mold die; and a second mold die disposed opposite to the first mold die, the second mold die having a second surface; wherein the first mold die includes a first part having a first surface facing the second surface of the second mold die and having an opening in a central region of the first surface; and a first step-like movable part capable of moving in the opening in both directions so that the first step-like movable part moves toward and away from the second mold die.

According to another aspect of the present invention, a molding method implemented by a mold resin sealing device including a first mold die and a second mold die, in which the first mold die includes a first part having a first surface and having an opening in a central region of the first surface, the first surface facing a second surface of the second mold die, the first mold die includes a first step-like movable part capable of moving in the opening in both directions so that the first step-like movable part moves toward and away from the second mold die, the method including: setting a semiconductor wafer on the second surface of the second mold die and setting a mold resin on the first step-like movable part of the first mold die; and moving the second mold die toward the first mold die to press and spread the mold resin; wherein the first step-like movable part is gradually moved away from the second mold die while the mold resin is pressed and spread by the second mold die.

In an aspect of the present invention, the first step-like movable part is capable of moving and forms a difference in step levels in the central region of the first mold die in order to prevent a flowing speed of the mold resin from becoming too fast in the outer circumference region of the semiconductor wafer during the mold clamping process. Therefore, it is possible to reduce voids occurring in the mold resin because of air involved in the vicinity of a post on a semiconductor wafer or the like.

Furthermore, in the present invention, the difference in step levels formed by the first step-like movable part is reduced as the molding process progresses. This offers an advantage that the molded resin after the molding process has no uneven surface or has only a slightly uneven surface.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE INVENTION

Figure 1:
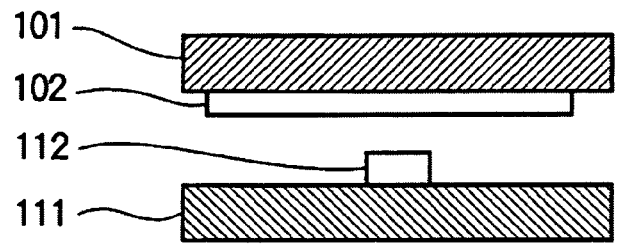
FIG. 1 is an explanatory diagram illustrating a conventional mold resin sealing device before a mold clamping process.
Figure 2:
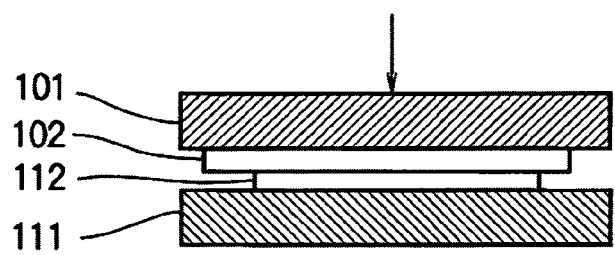
FIG. 2 is an explanatory diagram illustrating the mold resin sealing device in FIG. 1 during the mold clamping process.
Figure 3:
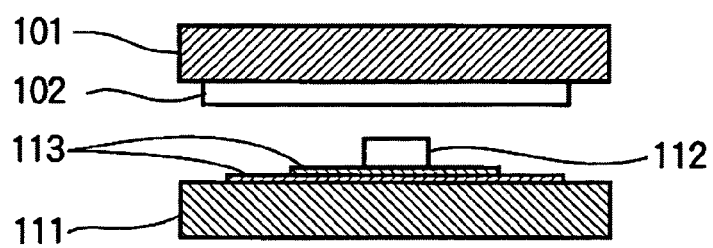
FIG. 3 is an explanatory diagram illustrating another conventional mold resin sealing device before a mold clamping process.
Figure 4:
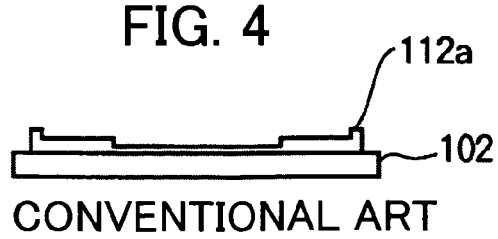
FIG. 4 is a schematic side view of a molded article made by the mold resin sealing device in FIG. 3.

Further scope of applicability of the present invention will become apparent from the detailed description given hereinafter. However, it should be understood that the detailed description and specific examples, while indicating preferred embodiments of the invention, are given by way of illustration only, since various changes and modifications will become apparent to those skilled in the art from the detailed description. In the attached drawings, like elements are indicated by like reference characters.

First Embodiment

Figure 5:
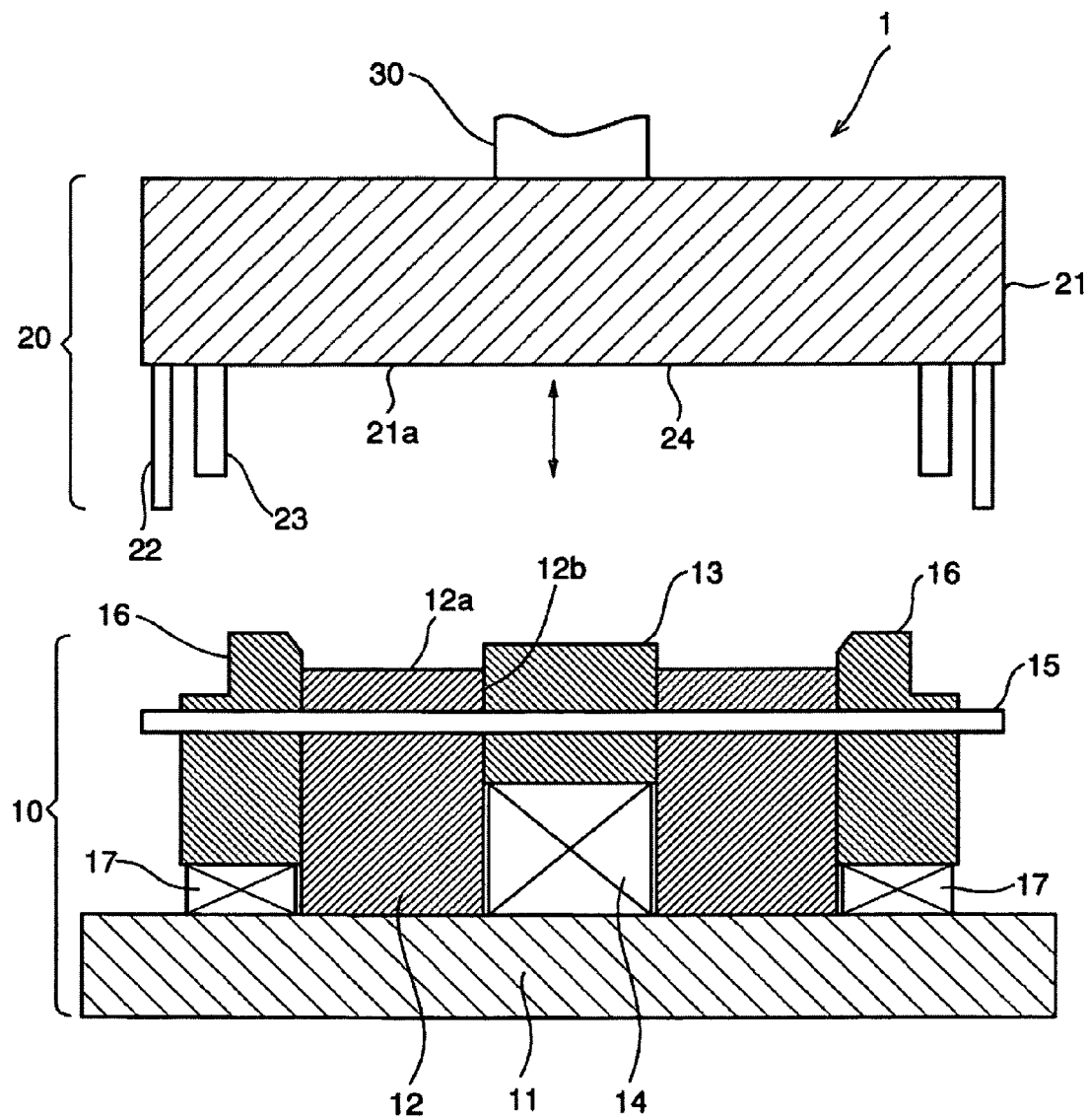
FIG. 5 is a cross-sectional view schematically, illustrating a structure of a mold resin sealing device according to a first embodiment of the present invention.
Figure 6A:
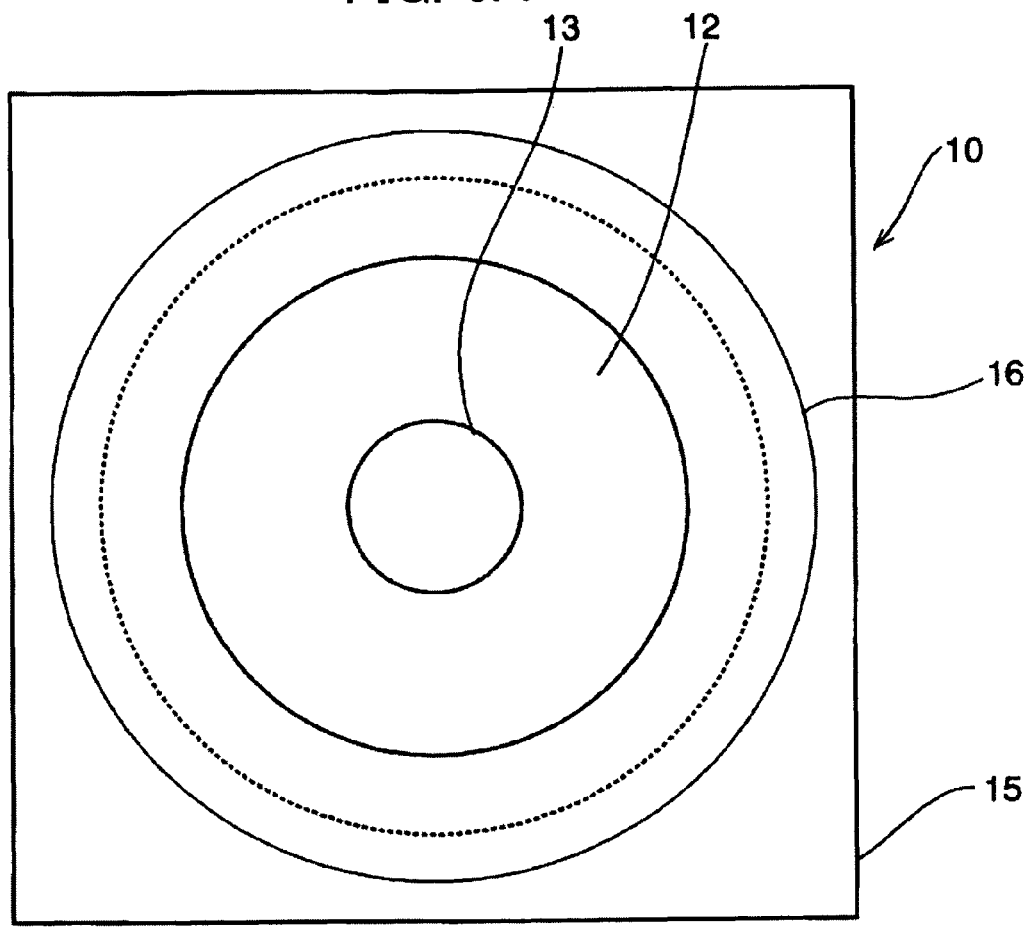
FIGS. 6A and 6B are an upper surface view and a cross-sectional view schematically illustrating a structure of a first mold die in the mold resin sealing device in FIG. 5, respectively.
Figure 6B:
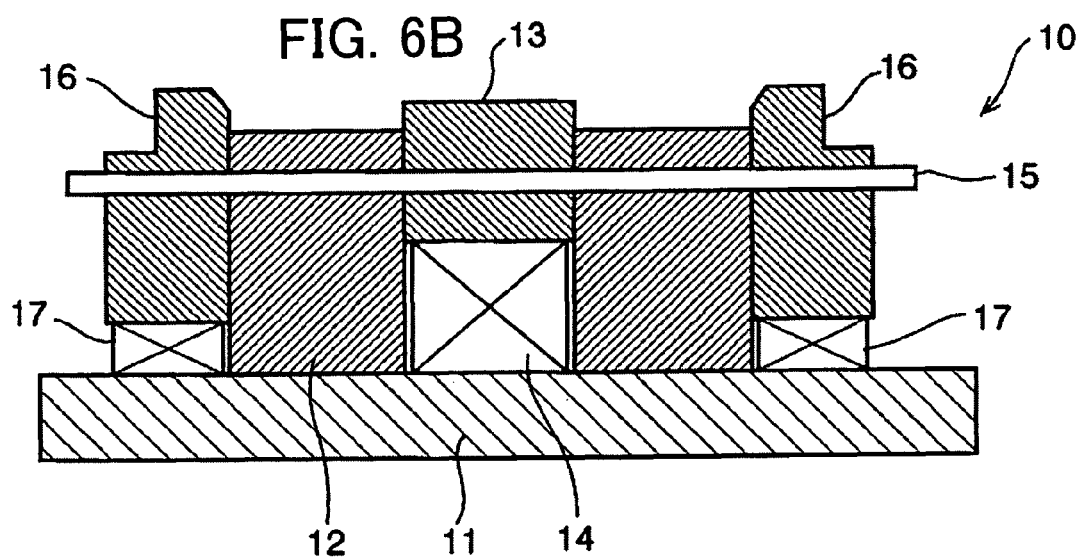
Figure 7A:
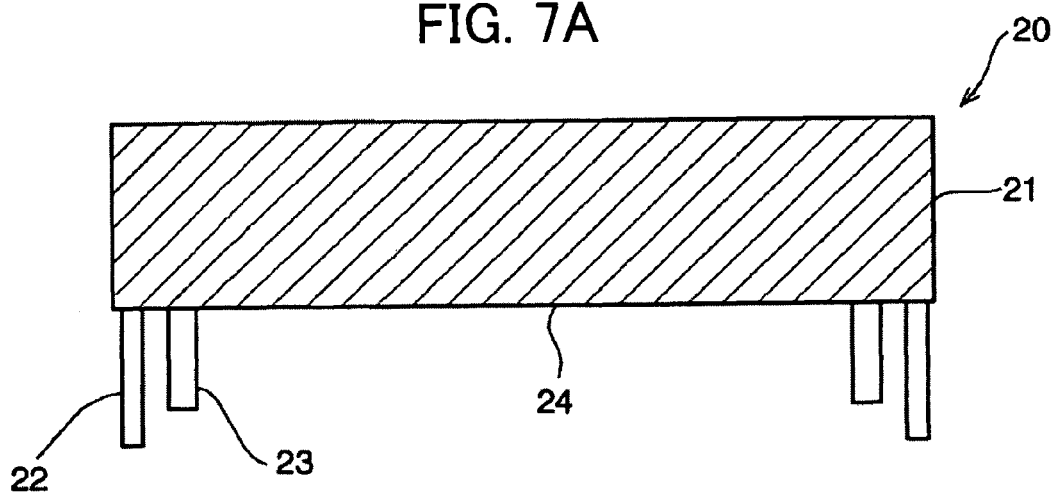
FIGS. 7A and 7B are a cross-sectional view and a lower surface view schematically illustrating a structure of a second mold die in the mold resin sealing device in FIG. 5, respectively.
Figure 7B:
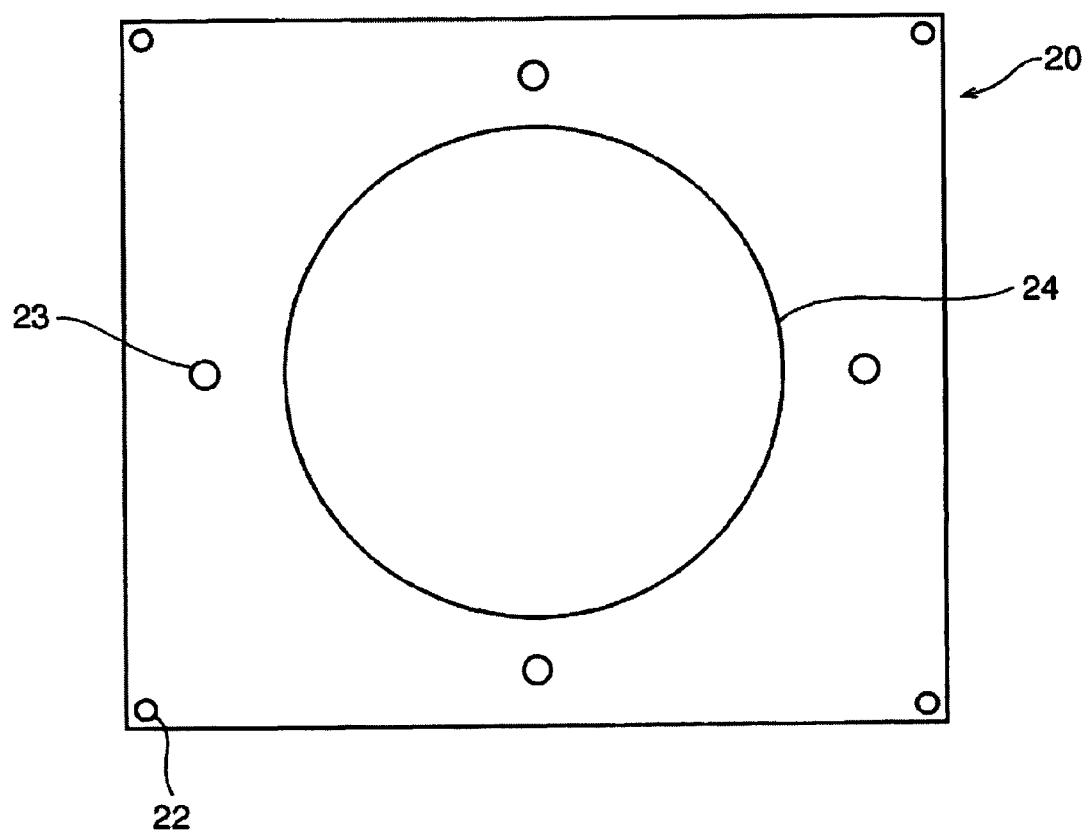

FIG. 5 is a cross-sectional view schematically illustrating a structure of a mold resin sealing device 1 according to a first embodiment of the present invention. FIGS. 6A and 6B are an upper surface view and a cross-sectional view schematically illustrating a structure of a first mold die 10 in the mold resin sealing device 1, respectively. FIGS. 7A and 7B are a cross-sectional view and a lower surface view schematically illustrating a structure of a second mold die 20 in the mold resin sealing device 1, respectively. The mold resin sealing device 1 according to the first embodiment is a device for manufacturing a semiconductor device sealed with a mold resin, such as a W-CSP (Wafer Level Chip Size Package). A molding method according to the first embodiment is a method of manufacturing the semiconductor device sealed with the mold resin and may be implemented by the mold resin sealing device 1.

As illustrated in FIG. 5, FIGS. 6A and 6B and FIGS. 7A and 7B, the mold resin sealing device 1 has the first mold die 10, the second mold die 20 disposed opposite to the first mold die 10, and a driving mechanism 30 for shifting the second mold die 20 in both directions so that the second mold die 20 moves toward and away from the first mold die 10. Although the driving mechanism 30 in this example is a mechanism formed by a motor, a gear and other elements which are not illustrated in the drawings, another mechanism may be used instead as long as it shifts at least one of the first mold die 10 and the second mold die 20 in the directions in which the distance between the first mold die 10 and the second mold die 20 is reduced and in which the distance is widened.

The first mold die 10 has a supporting unit 11 and a first part 12 which is, for example, a metal die disposed on the supporting unit 11. The first part 12 has a first surface 12a opposite to the second mold die 20, and an opening 12b formed in a central region of the first surface 12a. The first mold die 10 has a first step-like movable part 13 which is, for example, a metal die capable of moving along the opening 12b in both directions so that the first step-like movable part 13 moves toward and away from the second mold die (i.e., in the directions in which the distance to the second mold die 20 is reduced or widened), a first pressing unit 14 for applying a force to the first step-like movable part 13 to protrude the first step-like movable part 13 from the first surface 12a toward the second mold die 20, and a first return block 15 fixed to the first step-like movable part 13. Although the first pressing unit 14 is a spring in this example, a member or a mechanism other than the spring may be used instead as long as it applies a force to the first step-like movable part 13 to push the first step-like movable part 13 toward the second mold die 20. For example, any of a damper, an air cylinder, a mechanism formed by a motor and a gear, an elastic body such as rubber, and the like may be used as the first pressing unit 14.

The second mold die 20 has a second part 21. The second part 21 is a metal die which has a second surface 21a facing the first surface 12a of the first part 12 of the first mold die 10. The second mold die 20 has a first return pin or pins 22 as a first contact member or members which make contact with the first return block 15 and presses down the first return block 15 to move the first return block 15 and the first step-like movable part 13 together when the distance between the first mold die 10 and the second mold die 20 is reduced (e.g., when the second mold die 20 moves toward the first mold die 10 or when the first mold die 10 moves toward the second mold die 20).

The first mold die 10 has an outer-circumference holding block 16. The outer-circumference holding block 16 which has a ring-like shape forms a side wall of a cavity formed between the first surface 12a and the second surface 21a. The first mold die 10 has a second pressing unit 17 for applying a force to the outer-circumference holding block 16 to protrude the outer-circumference holding block 16 from the first surface 12a toward the second mold die 20. Although the second pressing unit 17 is a spring in this example, a member or a mechanism other than the spring may be used instead as long as it applies a force to the outer-circumference holding block to push the outer-circumference holding block 16 toward the second mold die 20. For example, any of a damper, an air cylinder, a mechanism formed by a motor and a gear, an elastic body such as rubber, and the like may be used as the second pressing unit 17. The second mold die 20 has a pin or pins 23 as a second contact member or members which press down the outer-circumference holding block 16 to move the outer-circumference holding block 16 when the distance between the first mold die 10 and the second mold die 20 is reduced. A central region of the second surface 21a of the second mold die 20 is a wafer absorbing stay 24 for absorbing a semiconductor wafer 40.

Figure 8:
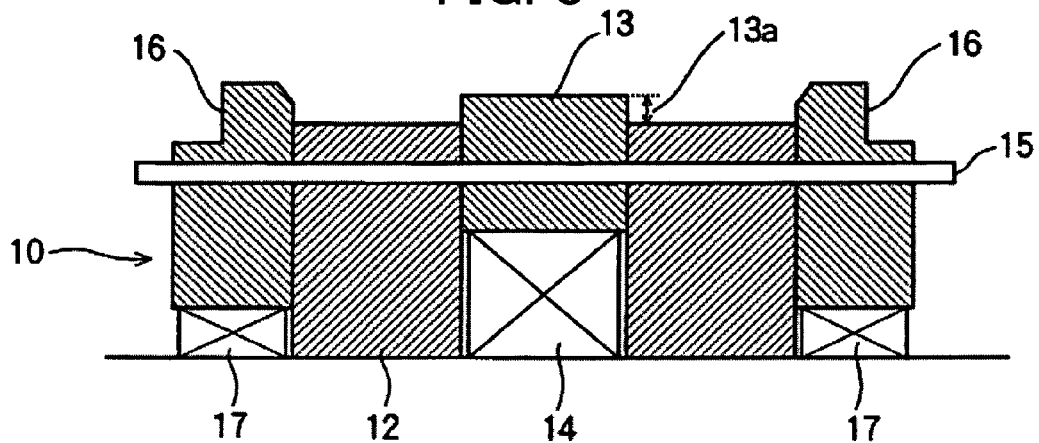
FIG. 8 and FIG. 9 are explanatory diagrams illustrating operation of a first step-like movable part and a first return block of the first mold die in the mold resin sealing device in FIG. 5.
Figure 9:
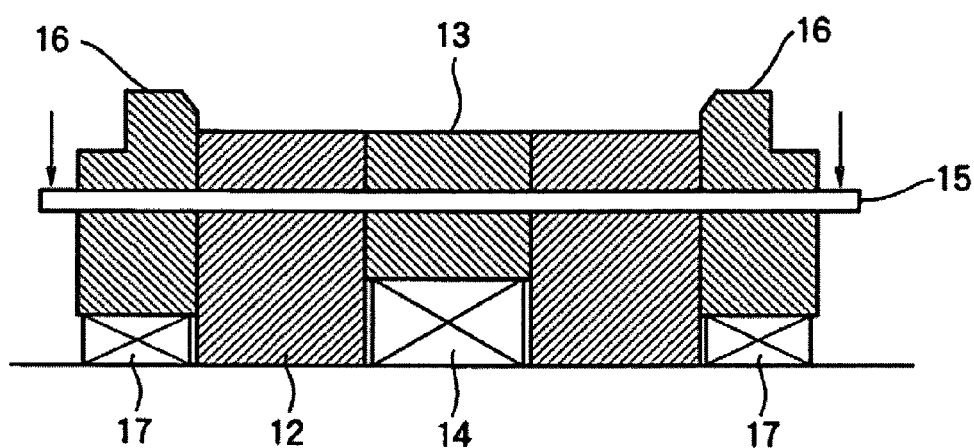

FIG. 8 and FIG. 9 are explanatory diagrams illustrating operations of the first step-like movable part 13 and the first return block 15 of the first mold die 10. As illustrated in FIG. 8, the first return block 15 is fixed to the first step-like movable part 13. As illustrated in FIG. 9, when a downward force is applied to the first step-like movable part 13 or the first return block 15, the first step-like movable part 13 and the first return block 15 move downward together while compressing the first pressing unit 14, and a difference in step levels (13a in FIG. 8) formed by the first step-like movable part 13 is gradually reduced and finally disappears. In other words, a height difference between upper surfaces of the first step-like movable part 13 and the first part 12 is reduced and then becomes zero. After the state illustrated in FIG. 9, when the downward force applied to the first step-like movable part 13 or the first return block 15 is reduced or applied no more, the first step-like movable part 13 and the first return block 15 are gradually moved upward (toward the second mold die 20) together by an upward force from the first pressing unit 14, and thus the difference in step levels 13a formed by the first step-like movable part 13 appears.

Figure 10:
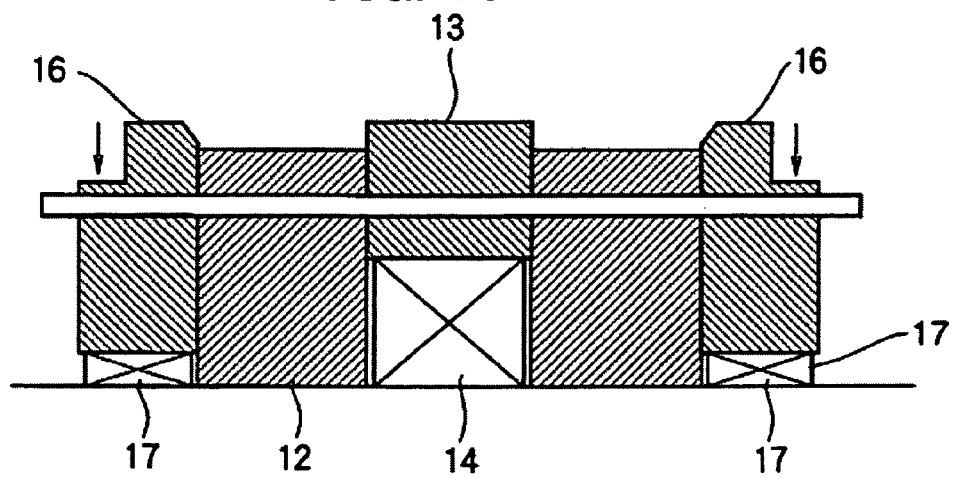
FIG. 10 is an explanatory diagram illustrating operations of an outer-circumference holding block of the first mold die in the mold resin sealing device in FIG. 5.

FIG. 10 is an explanatory diagram illustrating operations of the outer-circumference holding block 16 of the first mold die 10. As illustrated in FIG. 10, when a downward force is applied to the outer-circumference holding block 16, the outer-circumference holding block 16 moves down to a position lower than that illustrated in FIG. 8 while the outer-circumference holding block 16 compresses the second pressing unit 17. After the state illustrated in FIG. 10, if the downward force applied to the outer-circumference holding block 16 is reduced or applied no more, the outer-circumference holding block 16 is gradually moved upward (toward the second mold die 20) by an upward force from the second pressing unit 17 and then returns to the position illustrated in FIG. 8.

Next, the molding method according to the first embodiment (operations of the mold resin sealing device according to the first embodiment) will be explained. The molding method according to the first embodiment is a part of a semiconductor device manufacturing method which includes sealing the semiconductor wafer with the mold resin. FIG. 11 to FIG. 15 are schematic cross-sectional views illustrating first to fifth process in the molding method according to the first embodiment.

Figure 11:
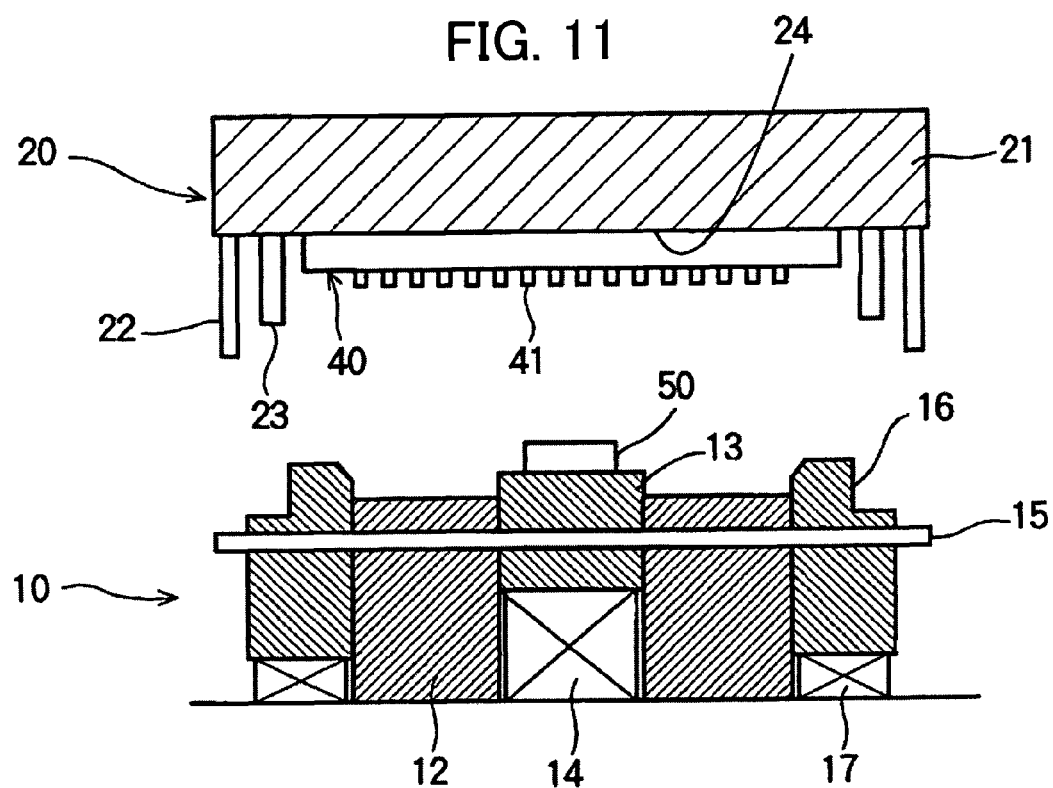
FIG. 11, FIG. 12, FIG. 13, FIG. 14 and FIG. 15 are schematic cross-sectional views illustrating process in a molding method according to the first embodiment.

First, as illustrated in FIG. 11, the semiconductor wafer 40 is set on the wafer absorbing stay 24 on the second part 21 of the second mold die 20, and a mold resin 50 as a sealing material is set on the first step-like movable part 13 of the first mold die 10.

Figure 12:
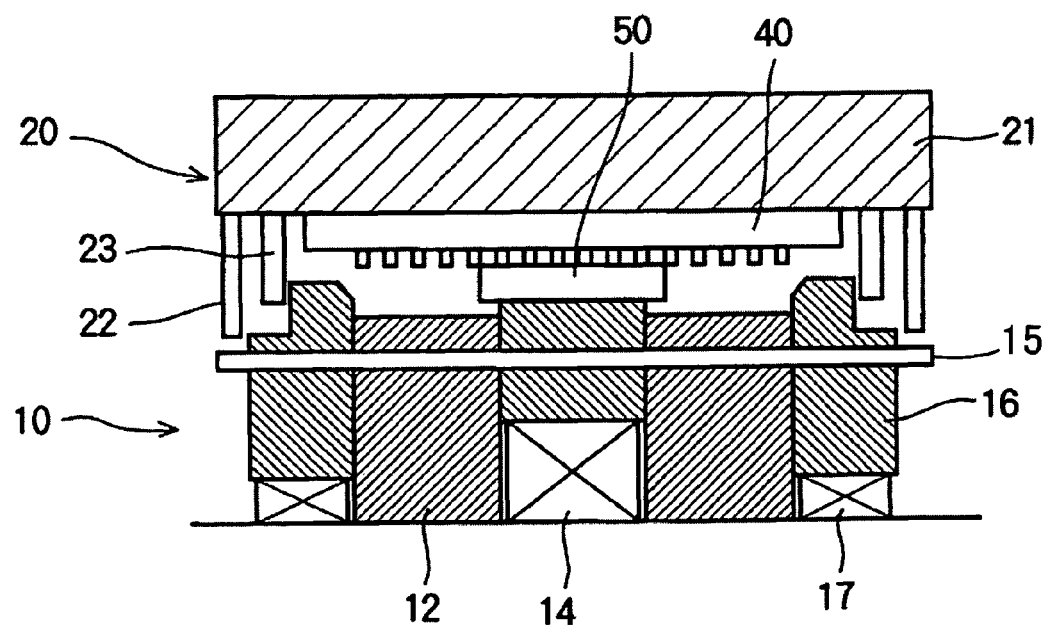
Figure 13:
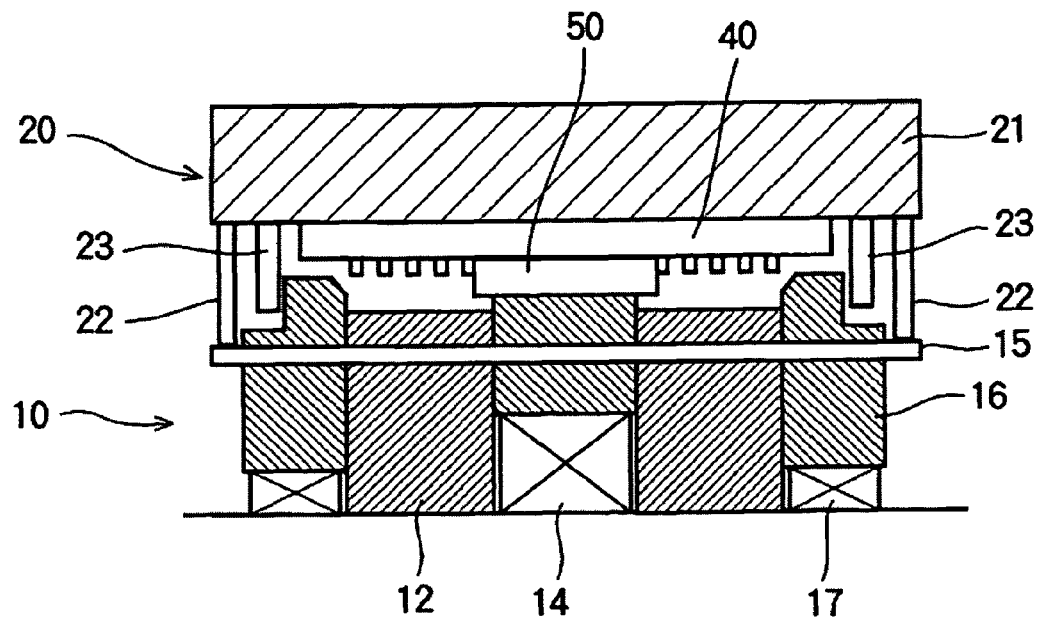

Next, as illustrated in FIG. 12, the second mold die 20 starts to move downward toward the first mold die 10. Then, as illustrated in FIG. 13, the second mold die 20 further moves downward, and the mold resin 50 is pressed and spread.

Figure 14:
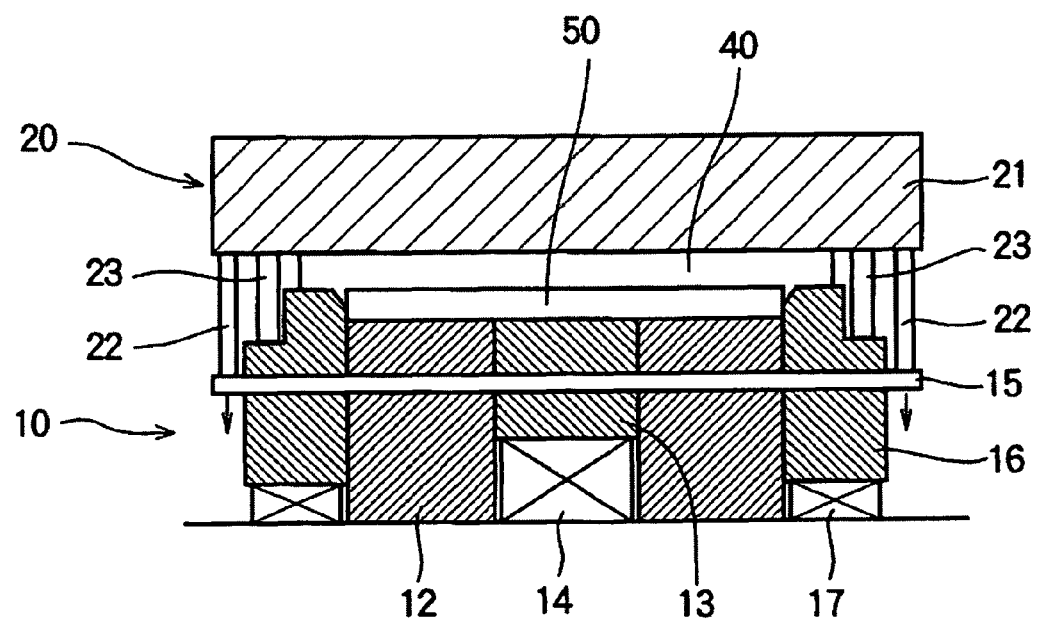

As illustrated in FIG. 14, when the second mold die 20 moves still further downward, the mold resin 50 is further pressed and spread. While the mold resin 50 is pressed and spread on the semiconductor wafer 40, the first return pin 22 presses down the first return block 15, the first step-like movable part 13 moves downward concurrently with the movement of the first return block 15, and thus the difference in step levels formed by the first step-like movable part 13 is reduced. Thereafter, the pin member 23 makes contact with the outer-circumference holding block 16 and presses down the outer-circumference holding block 16.

Figure 15:
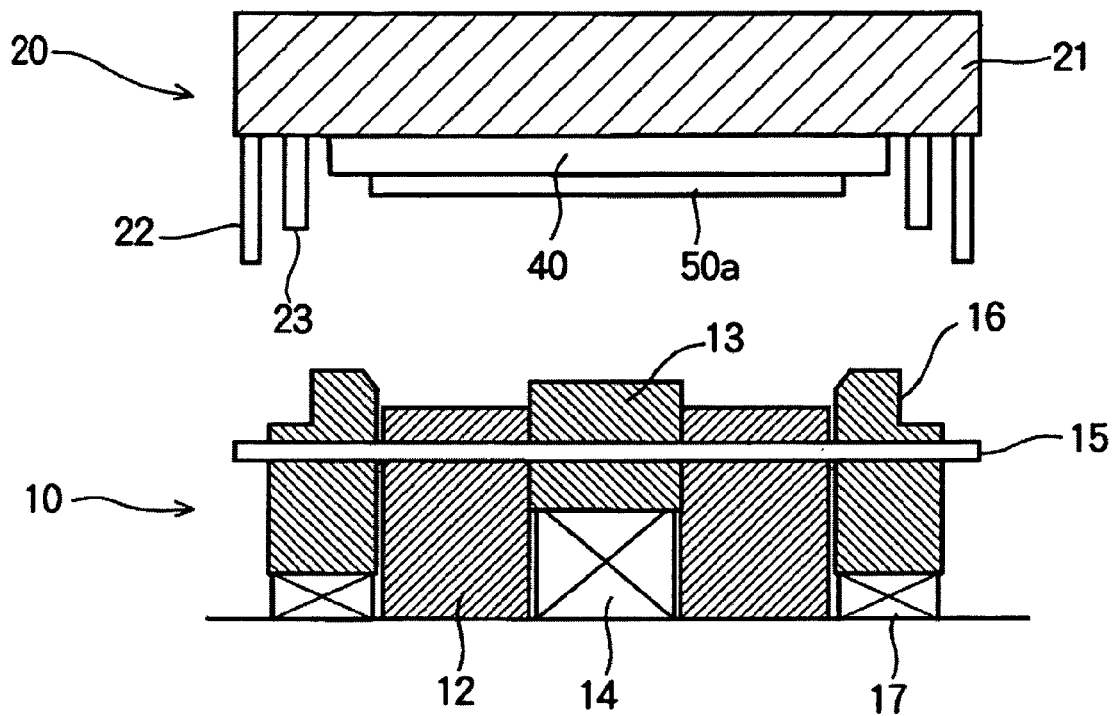

When the second mold die 20 moves down to a predetermined position (for example, detected by a detector not illustrated in the drawing or the like) and the difference in step levels formed by the first step-like movable part 13 disappears (i.e., a height difference between upper surfaces of the first step-like movable part 13 and the first part 12 is reduced and then becomes zero), the second mold die 20 is moved upward as illustrated in FIG. 15. At the time, the semiconductor wafer 40 with a molded resin 50a after the molding process is absorbed by the second mold die 20.

As described above, the mold resin sealing device 1 or the molding method according to the first embodiment provides the first step-like movable part 13 which is movable and forms the difference in step levels in the central region of the first mold die 10 in order to prevent a flowing speed of the mold resin from becoming too fast in an outer circumference part of the semiconductor wafer 40, thereby enabling to reduce voids which may occur in the mold resin because of air involved at a post 41 (FIG. 11) on the semiconductor wafer 40 (jetting, for example) and the like.

Because the flowing speed of the mold resin is not too fast in the outer circumference part of the semiconductor wafer 40 in the mold resin sealing device 1 or the molding method according to the first embodiment, it is unnecessary to reduce a size of a filler included in a filling agent for the mold resin in order to improve fluidity of the mold resin. Thus, no expensive small-size filler is required and it is possible to reduce a cost of sealing with the mold resin.

Moreover, as it is understandable from FIG. 13 and FIG. 14, in the mold resin sealing device 1 or the molding method according to the first embodiment, the difference in step levels formed by the first step-like movable part 13 is reduced as the molding process progresses, therefore the molded resin after the molding process has no uneven surface or only a slightly uneven surface.

Second Embodiment

Figure 16:
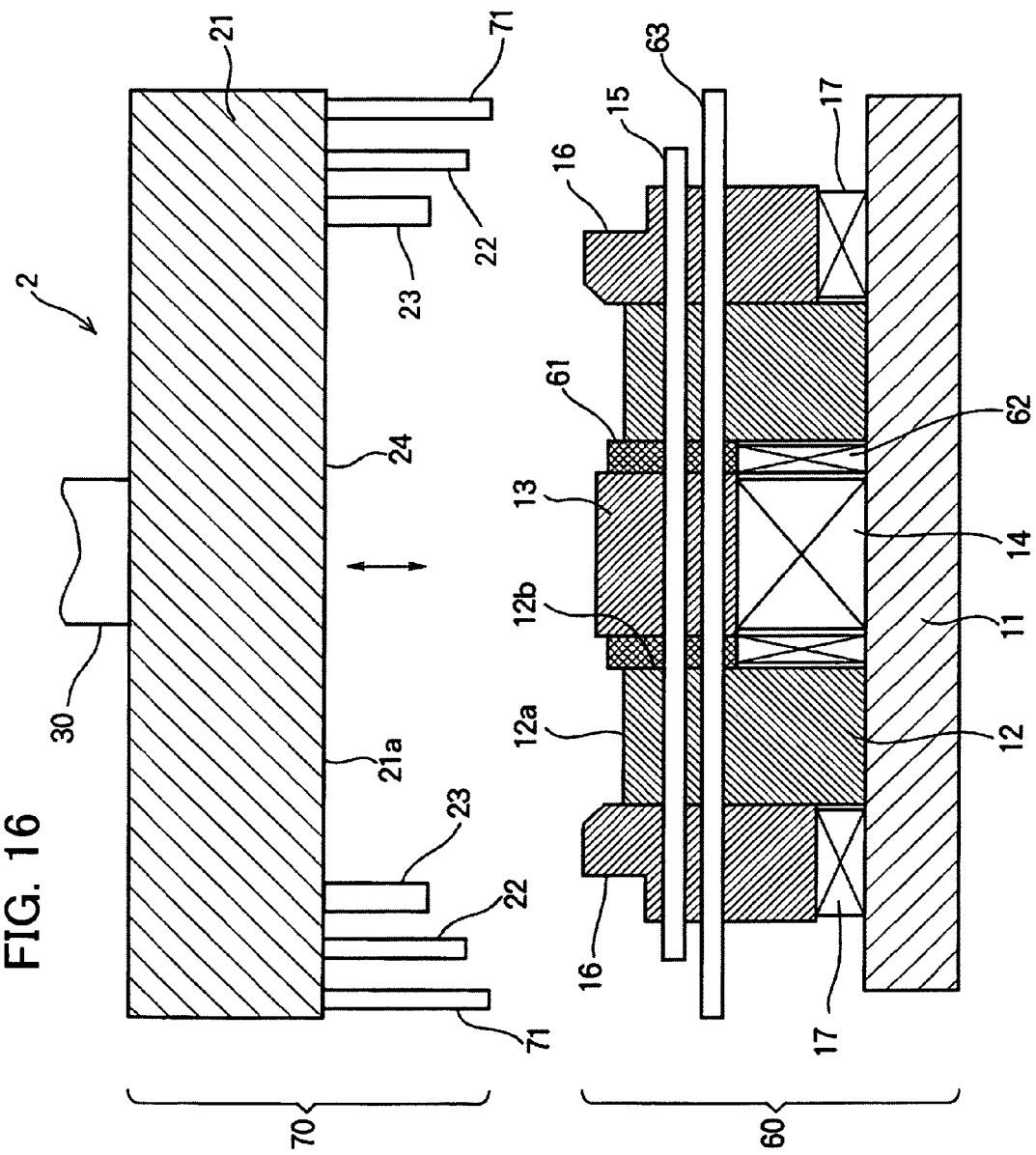
FIG. 16 is a cross-sectional view schematically illustrating a structure of a mold resin sealing device according to a second embodiment of the present invention.

FIG. 16 is a cross-sectional view schematically illustrating a structure of a mold resin sealing device 2 according to a second embodiment of the present invention. In FIG. 16, elements which are the same as or correspond to those in FIG. 5 (the first embodiment) are represented by the same numerals. As illustrated in FIG. 16, the mold resin sealing device 2 has the first mold die 60, the second mold die 70 disposed opposite to the first mold die 60, and the driving mechanism 30 for shifting the second mold die 70 in both directions so that the second mold die 70 moves toward and away from the first mold die 60. Another mechanism may be used instead as long as shifts at least one of the first mold die 10 and the second mold die 20 in the directions in which the distance between the first mold die 10 and the second mold die 20 is reduced and in which the distance is widened.

In the mold resin sealing device 2 according to the second embodiment, a first mold die 60 has a second step-like movable part 61 which is disposed in an opening 12b so as to surround a first step-like movable part 13 and disposed lower than the first step-like movable part 13 and higher than a first surface 12a, a third pressing unit 62 which applies a force to the second step-like movable part 61 to protrude the second step-like movable part 61 from the first surface 12a toward a second mold die 70, and a second return block 63 which is fixed to the second step-like movable part 61. Although the third pressing unit 62 is a spring in this example, a member or a mechanism other than the spring may be used instead as long as it applies a force to the second step-like movable part 61 to push the second step-like movable part 61 toward the second mold die 70. For example, any of a damper, an air cylinder, a mechanism formed by a motor and a gear, an elastic body such as rubber, and the like may be used as the third pressing unit 62.

The second mold die 70 of the mold resin sealing device 2 according to the second embodiment has a second part 21 which is, for example, a metal die, and a second return pin 71 as a third contact member which makes contact with the second return block 63 and presses down the second step-like movable part 61 to move the second step-like movable part 61 and the second return block 63 together when a distance between the first mold die 60 and the second mold die 70 is reduced.

In a molding method implemented by the mold resin sealing device 2 according to the second embodiment, at first, a semiconductor wafer is set on a wafer absorbing stay 24 of the second part 21 of the second mold die 70, and a mold resin is set on the first step-like movable part 13 of the first mold die 60.

Next, the second mold die 70 is moved downward (i.e., toward the first mold die 60) and thereby the mold resin is pressed and spread. At the time that the mold resin is pressed and spread by the downward movement of the second mold die 20, while the mold resin is pressed and spread on the semiconductor wafer, the first return pin 22 presses down the first return block 15 and the first step-like movable part 13 moves downward concurrently with the downward movement of the first return block 15. At the same time, the second return pin 71 presses down the second return block 63, and the second step-like movable part 61 moves downward concurrently with the downward movement of the second return block 63.

The second mold die 70 is moved down to a predetermined position, and thereafter the second mold die 70 is moved up. At the time, the semiconductor wafer with a molded resin after the molding process is absorbed by the second mold die 70.

As described above, the mold resin sealing device 2 or the molding method according to the second embodiment provides the first step-like movable part 13 and the second step-like movable part 61 which are movable and form a difference in step levels in a central region of the first mold die 60 in order to prevent a flowing speed of the mold resin from becoming too fast in an outer circumference part of the semiconductor wafer, thereby enabling to reduce voids which may occur in the mold resin because of air involved at a post 41 on the semiconductor wafer (jetting, for example) and the like.

Because the flowing speed of the mold resin is not too fast in the outer circumference part of the semiconductor wafer in the mold resin sealing device 2 or the molding method according to the second embodiment, it is unnecessary to reduce a size of a filler included in a filling agent for the mold resin in order to improve fluidity of the mold resin. Thus, no expensive small-size filler is required and it is possible to reduce cost of sealing with the mold resin.

Moreover, in the mold resin sealing device 2 or the molding method according to the second embodiment, the difference in step levels formed by the first step-like movable part 13 and the second step-like movable part 61 is reduced as the molding progresses, therefore the molded resin after the molding process has no uneven surface or a slightly uneven surface.

Although the above examples explain cases that the first and second return blocks 15, 63 and the first and second return pins 22, 71 are provided, it is possible to obtain a flowing speed of the mold resin which is not too fast in the outer circumference part of the semiconductor wafer without these elements, because the difference in step levels is reduced by applying the downward force to press the first and second step-like movable parts 13, 61 through the mold resin during the clamping process. Thus, some voids are reduced without the first and second return blocks 15, 63 and the first and second return pins 22, 71.

Although the above examples explain cases that one or two step-like movable parts are provided in a radial direction (i.e., the first step-like movable part, or the first and second step-like movable parts), three or more step-like movable parts may be provided. Thus, by increasing the number of the step-like movable parts, it is possible to obtain a mold resin sealing device applicable to a molding method for a large-size semiconductor wafer.

The invention being thus described, it will be obvious that the same may be varied in many ways. Such variations are not to be regarded as a departure from the spirit and scope of the invention, and all such modifications as would be obvious to one skilled in the art are intended to be included within the scope of following claims.

What is claimed is:

1. A molding method implemented by a mold resin sealing device including a first mold die and a second mold die, in which the first mold die includes a first part having a first surface and having an opening in a central region of the first surface, the first surface facing a second surface of the second mold die, the first mold die includes a first step-like movable part capable of moving in the opening in a first direction toward the second mold die and a second direction away from the second mold die, the method comprising:
    setting a semiconductor wafer on the second surface of the second mold die and setting a mold resin on an upper surface of the first step-like movable part, the upper surface being higher than the first surface; and
    moving the second mold die toward the first mold die to press and spread the mold resin,
    wherein the first step-like movable part is moved in the second direction away from the second mold die to thereby reduce a height difference between the first surface and the upper surface while the mold resin is pressed and spread by the second mold die,
    wherein the height difference is zero when the pressing and spreading of the mold resin is completed.

2. The method according to claim 1, wherein the first mold die includes a first return block fixed to the first step-like movable part, the second mold die includes a second part having the second surface facing the first surface, and the second mold die includes a first contact member for making contact with the first return block and pressing down the first return block and the first step-like movable part when a distance between the first mold die and the second mold die is reduced,
    wherein the moving of the first step-like movable part is implemented by pressing down the first return block by the first contact member.

3. The method according to claim 1, wherein when the height difference becomes zero, the second mold die is moved away from the first mold die.

4. The method according to claim 1, wherein the first surface contacts the mold resin as the mold resin is pressed and spread by the second mold die.

5. The method according to claim 1, wherein when the height difference becomes zero, the first surface contacts the mold resin.

6. A molding method implemented by a mold resin sealing device including a first mold die and a second mold die, in which the first mold die includes a first part having a first surface and having an opening in a central region of the first surface, the first surface facing a second surface of the second mold die, the first mold die includes a first step-like movable part capable of moving in the opening in a first direction toward the second mold die and a second direction away from the second mold die, the method comprising:
    setting a semiconductor wafer on the second surface of the second mold die and setting a mold resin on the first step-like movable part; and
    moving the second mold die toward the first mold die to press and spread the mold resin,
    wherein the first step-like movable part is moved in the second direction away from the second mold die while the mold resin is pressed and spread by the second mold die,
    further wherein the first mold die includes a first return block fixed to the first step-like movable part, the second mold die includes a second part having the second surface facing the first surface, and the second mold die includes a first contact member for making contact with the first return block and pressing down the first return block and the first step-like movable part when a distance between the first mold die and the second mold die is reduced,
    further wherein the moving of the first step-like movable part is implemented by pressing down the first return block by the first contact member, further wherein the first mold die includes a second step-like movable part disposed in the opening so as to surround the first step-like movable part and disposed lower than the first step-like movable part and higher than the first surface, the first mold die includes a pressing unit for applying a force to the second step-like movable part to protrude the second step-like movable part from the first surface toward the second mold die, the first mold die includes a second return block fixed to the second step-like movable part, and the second mold die includes a second contact member for making contact with the second return block and pressing down the second return block to move the second return block and the second step-like movable part when the distance between the first mold die and the second mold die is reduced, wherein the moving of the second step-like movable part is implemented by pressing down the second return block by the second contact member.

\* \* \* \* \*